US006965280B2

(12) United States Patent
Chen

(10) Patent No.: US 6,965,280 B2
(45) Date of Patent: Nov. 15, 2005

(54) THREE WAY POWER SPLITTER

(76) Inventor: Lu Chen, 63 Avenue V, Brooklyn, NY (US) 11223

( * ) Notice: Subject to any disclaimer, the term of this patent is extended or adjusted under 35 U.S.C. 154(b) by 0 days.

(21) Appl. No.: 10/850,511

(22) Filed: May 21, 2004

(65) Prior Publication Data

US 2005/0146395 A1 Jul. 7, 2005

Related U.S. Application Data

(60) Provisional application No. 60/533,797, filed on Jan. 2, 2004.

(51) Int. Cl.[7] .................................................. H03H 7/38
(52) U.S. Cl. ........................ 333/131; 333/119; 333/118
(58) Field of Search ......................... 333/131, 119, 118

(56) References Cited

U.S. PATENT DOCUMENTS 3,349,345 A * 10/1967 Winegard ................... 333/131
4,817,189 A * 3/1989 Pfizenmaier et al. ........ 375/258
5,006,822 A * 4/1991 Reddy ........................ 333/112
5,495,212 A * 2/1996 DeCramer ................... 333/25
5,742,213 A * 4/1998 Reynolds .................... 333/131
5,752,181 A * 5/1998 Vice ........................... 455/326
6,111,465 A * 8/2000 Kakuta et al. .............. 330/276
6,114,924 A * 9/2000 Cain et al. .................. 333/112
6,281,779 B1 * 8/2001 Matsumoto et al. ........ 336/200
6,542,047 B2 * 4/2003 Chen et al. ................. 333/119
6,784,521 B2 * 8/2004 Setty et al. ................. 257/662
6,806,790 B2 * 10/2004 Ji .............................. 333/119
2002/0186096 A1 * 12/2002 Zheng et al. ............... 333/131
2003/0151136 A1 * 8/2003 Ji .............................. 257/724

* cited by examiner

*Primary Examiner*—Benny Lee
*Assistant Examiner*—Kimberly Glenn
(74) *Attorney, Agent, or Firm*—Kevin Redmond

(57) ABSTRACT

A three way power splitter that has a small package size. The three way power splitter includes a multi-layered low temperature co-fired ceramic substrate. An input transformer and three output transformers are attached to the top of the substrate. The transformers have wires that are attached to terminals on the top of the substrate. Three resistors are located on the top surface of the substrate under the transformers. A capacitor is located within the substrate. Terminals are also located on the bottom of the substrate. Several conductive vias extend through the substrate and connect the resistors, the capacitor and the terminals.

25 Claims, 11 Drawing Sheets

THREE WAY POWER SPLITTER

This claims the benefit of Provisional Application No. 60/533,797, filed Jan. 2, 2004.

BACKGROUND

1. Field of the Invention

This invention relates to power splitters used with RF and microwave frequency signals in general and more particularly to a three way power splitter having a small package size that can be manufactured at low cost.

2. Description of the Related Art

Three way power splitters operating at frequencies below 1.5 GHz have been made with four ferrite core transformers along with appropriate resistors and capacitors arranged around the ferrite core transformers. These splitters provide multi-decade bandwidth. The power splitter components are typically packaged on a printed circuit board.

Referring to FIG. 1, a schematic diagram of a three way power splitter 20 is shown. Three way power splitter 20 has an input port 22 and three output ports 23, 24 and 25. An input matching transformer T1 is connected to input port 22. Output transformer T2 is connected to output port 23. Output transformer T3 is connected to output port 24. Output transformer T4 is connected to output port 25.

A capacitor C1 is connected between the transformers and ground. The series combination of resistor R1 and R3 is connected between output ports 23 and 25. Resistor R2 is connected between the junction of resistors R1 and R3 and output port 24. The input transformer T1 provides a 50 ohm impedance at the input. Capacitor C1 is required to match the reactive part of the impedance. The resistors R1, R2 and R3 provide isolation between the output ports 23, 24 and 25. Power splitter 20 is a 3 way power splitter since the input signal is split into three nearly equal output signals.

Referring to FIGS. 2–4, a prior art power splitter package 50 is shown. Power splitter package 50 has a printed circuit board 52 upon which are mounted a single core transformer 54 and two binocular core transformers 56 and 58. A chip capacitor 60 is soldered onto circuit board 52. Transformer 54 has several wires 61 wrapped around the core. A portion of wires 61 are twisted together to form a twisted pair 62. Transformer 56 has several wires 63 wrapped around the core. A portion of wires 63 are twisted together to form a twisted pair 64. Transformer 58 has several wires 65 wrapped around the core. A portion of wires 65 are twisted together to form a twisted pair 66.

Metal wrap around leads 68 are attached to the sides of printed circuit board 52 in order to make an electrical connection to the bottom side of circuit board 52. The transformer wires are welded to leads 68. The metal leads 68 would be soldered to an external printed circuit board (not shown) in an external electrical circuit. The three resistors R1, R2 and R3 would also have to be attached to printed circuit board 52.

Unfortunately, placing the capacitor next to the transformers takes up additional circuit board space and results in a larger overall package size. In addition, placing the capacitor complicates the assembly program followed by surface mount assembly equipment. This leads to lower production by the assembly machinery and higher cost. The use of the twisted pair wires results in a time consuming assembly process that is difficult to automate.

While power splitters have been used, they have suffered from being too large, difficult to assemble and expensive to produce. A current unmet need exists for a power splitter that takes up less printed circuit board space and that can be easily assembled.

SUMMARY

It is a feature of the invention to provide a power splitter having a small package size that can be readily assembled.

Another feature of the invention is to provide a power splitter that takes up less printed circuit board space and that can be manufactured at low cost.

A further feature of the invention is to provide a three way power splitter that includes a substrate having a first, second, third, fourth and fifth layer. An input transformer is attached to the first layer. The input transformer has a first wire connected to an input port and a second wire connected to a ground terminal. A first output transformer is attached to the first layer. The first output transformer has a third wire connected to a first output port. A second output transformer is attached to the first layer. The second output transformer has a fourth wire connected to a second output port. A third output transformer is attached to the first layer. The third output transformer has a fifth wire connected to a third output port. A first resistor is located on the first layer under the first transformer. The first resistor has one end connected to the first output port. A second resistor is located on the first layer under the second transformer. The second resistor has one end connected to the second output port. A third resistor is located on the first layer under the third transformer. The third resistor has one end connected to the third output port. The other ends of the resistors are connected together in common. A capacitor is formed on the fourth layer. The capacitor is connected to the second wire. Several vias extend through the substrate. The vias electrically connect the resistors, the capacitor and the wires.

It is noted that the drawings of the invention are not to scale.

DETAILED DESCRIPTION

Figure 1:
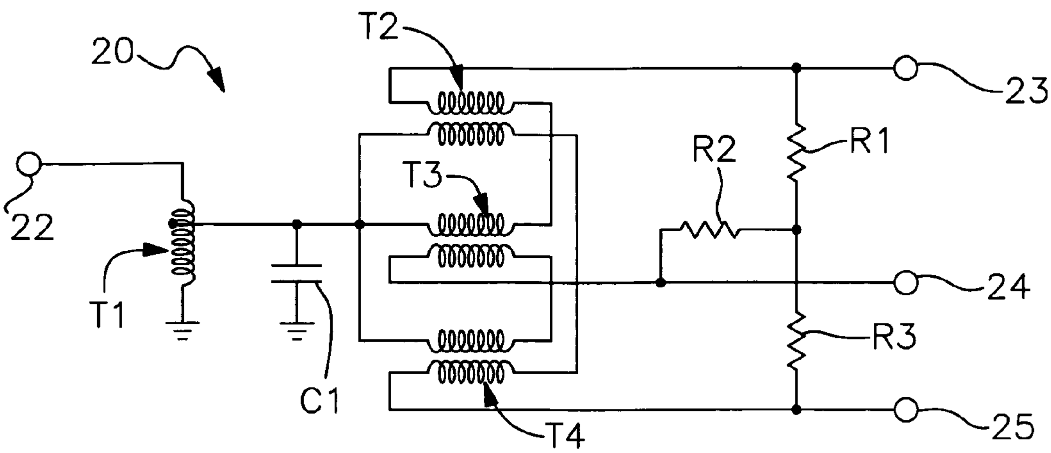
FIG. 1 is an electrical schematic of a three way power splitter.
Figure 2:
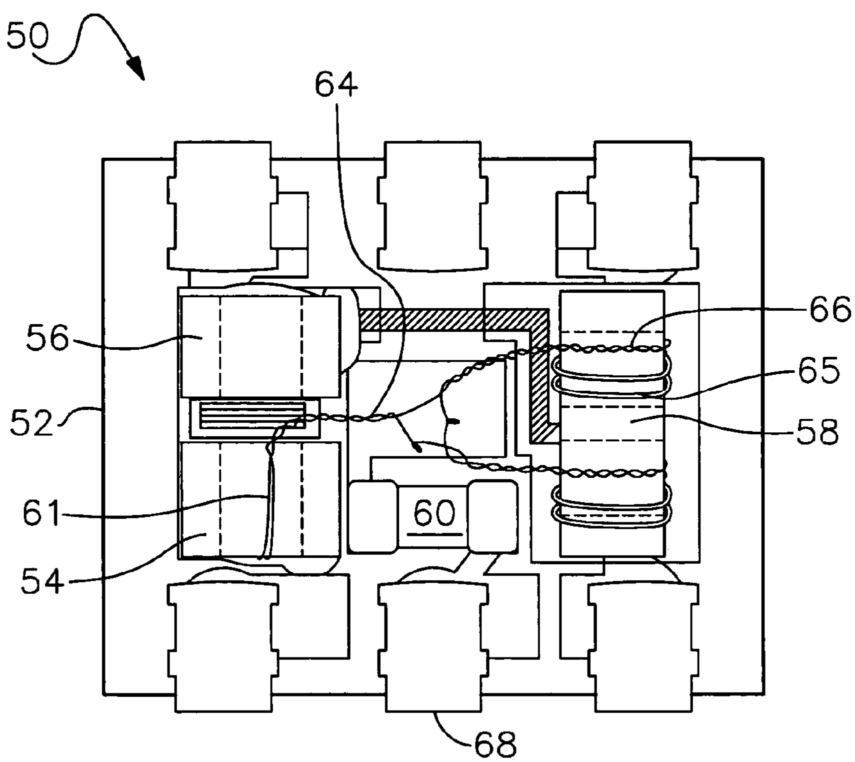
FIG. 2 is a top view of a prior art power splitter package.
Figure 3:
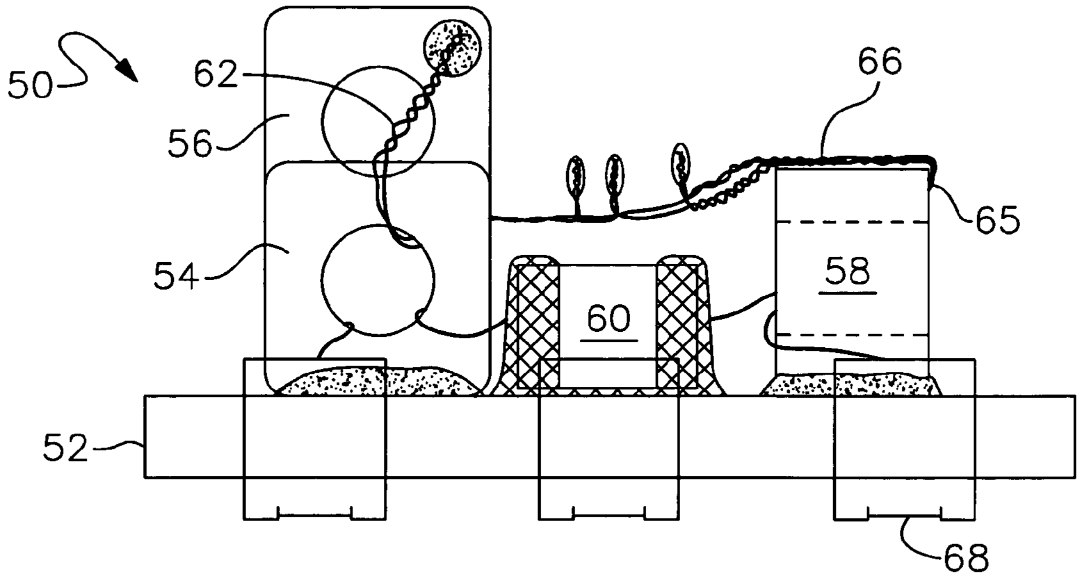
FIG. 3 is a side view of FIG. 2.
Figure 4:
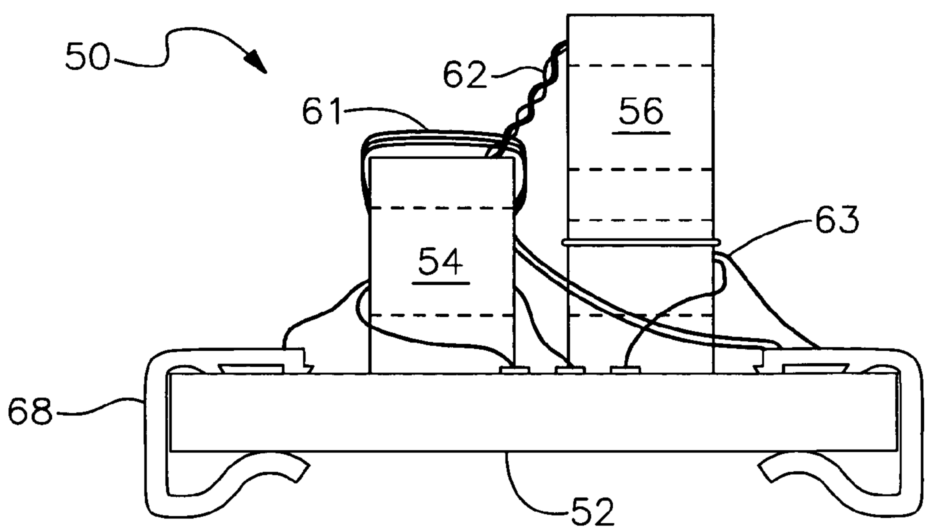
FIG. 4 is another side view of FIG. 2.
Figure 5:
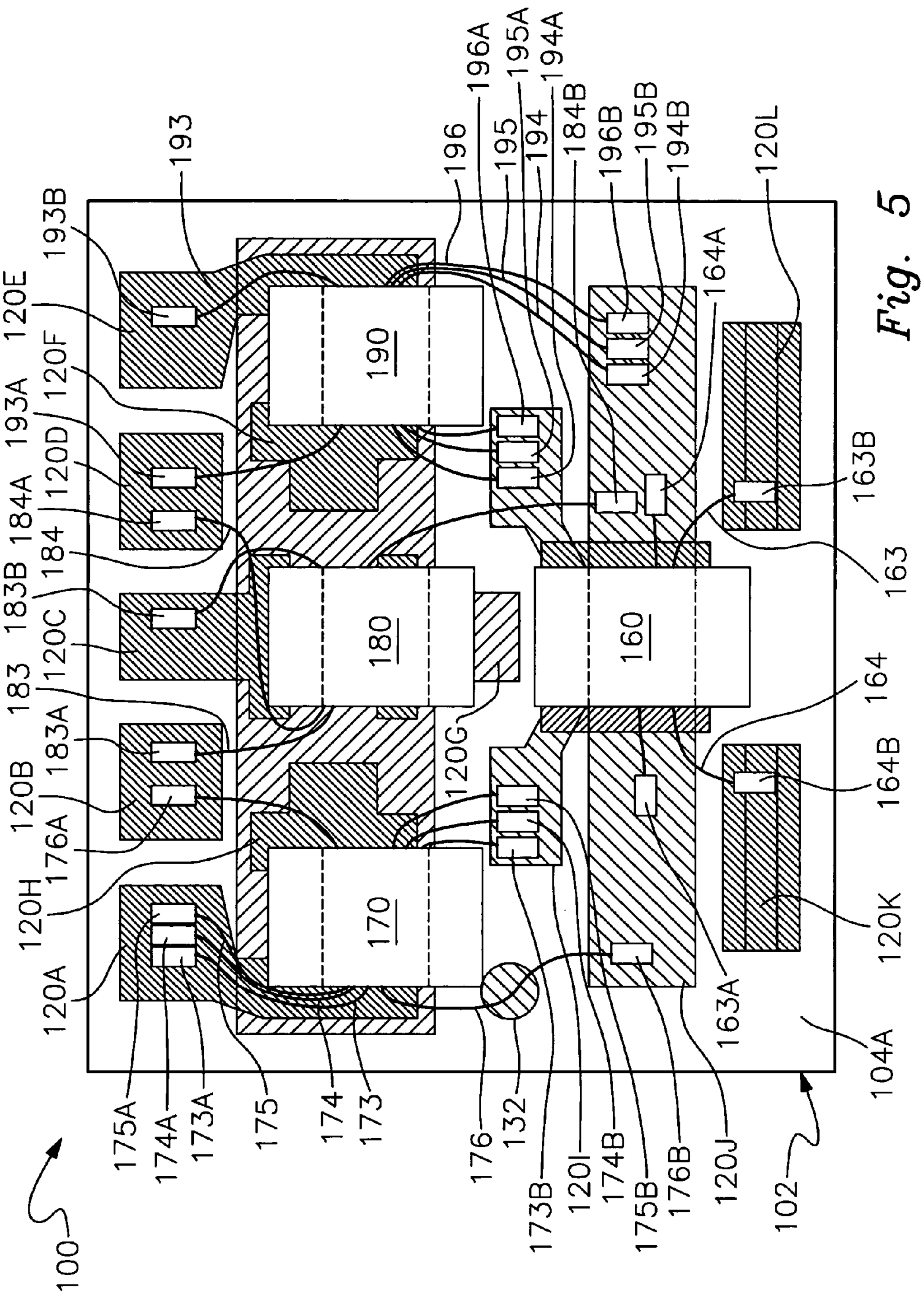
FIG. 5 is a top view of a three way power splitter in accordance with the present invention.
Figure 6:
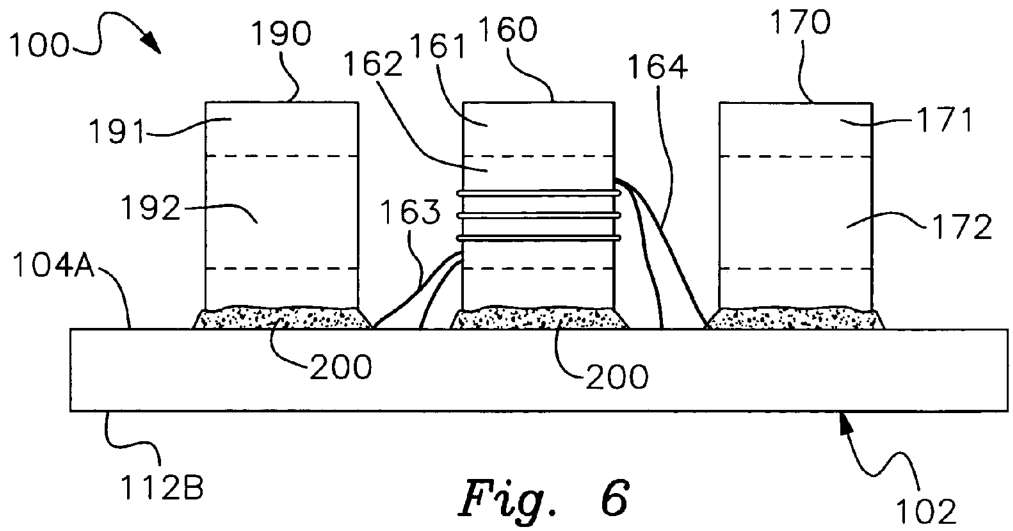
FIG. 6 is a side view of FIG. 5.
Figure 7:
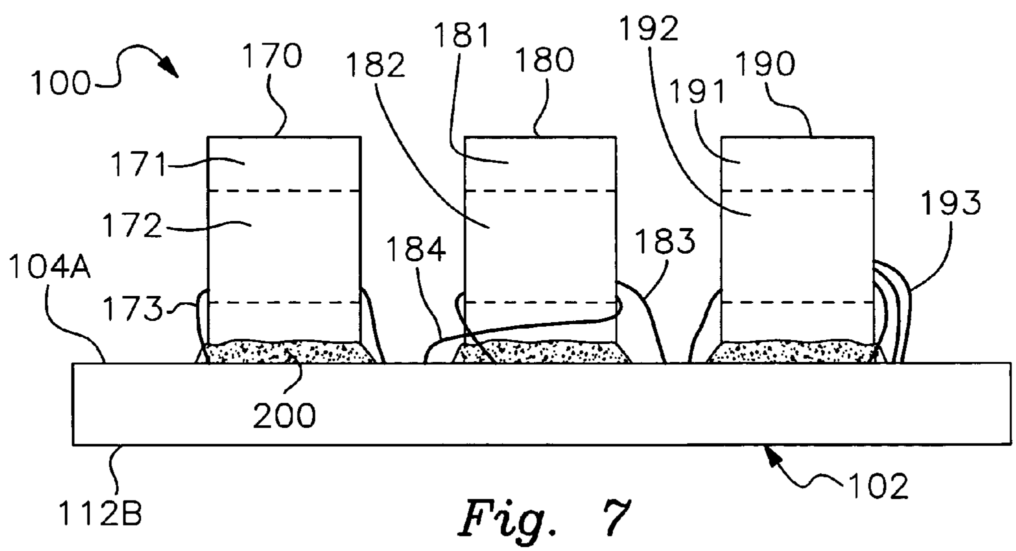
FIG. 7 is another side view of FIG. 5.

Referring to FIGS. 5–9, the electrical schematic of the power splitter of FIG. 1 is realized in a physical package in accordance with the present invention. Three way power splitter 100 has a multi-layered low temperature co-fired ceramic (LTCC) substrate 102. Substrate 102 has a top surface 104A and bottom surface 112B.

Figure 8:
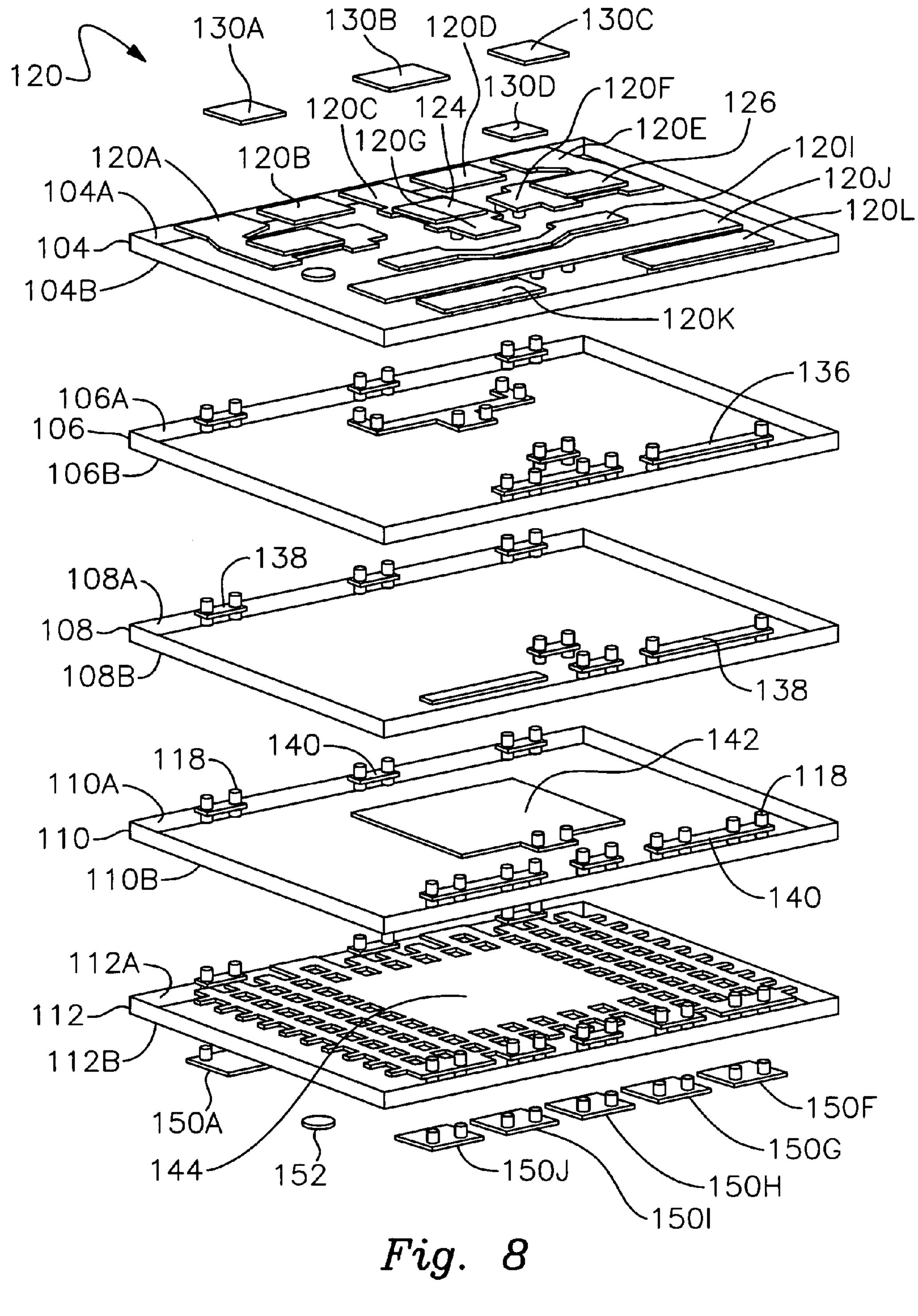
FIG. 8 is an exploded view of the substrate of the present invention.
Figure 9:
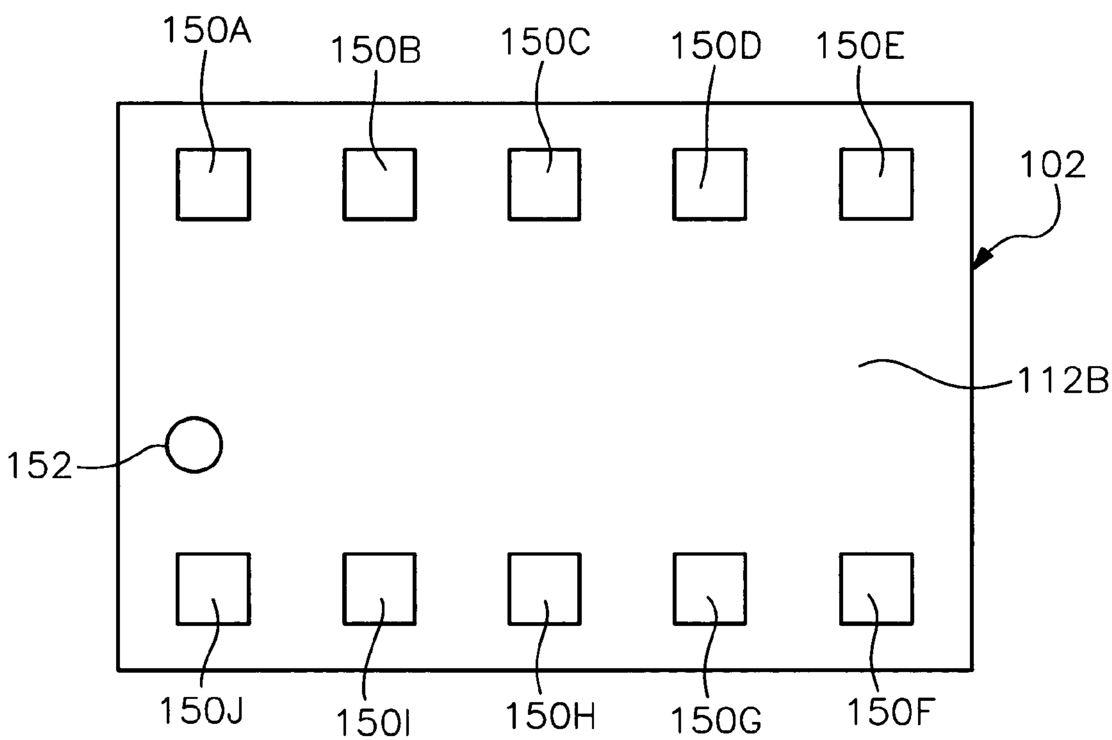
FIG. 9 is a bottom view of FIG. 5.

FIG. 8 shows an exploded view of low temperature co-fired ceramic substrate 102. LTCC substrate 102 is comprised of multiple layers of conventional low temperature co-fired ceramic material. Planar layers 104, 106, 108, 110 and 112 are all stacked on top of each other and form a unitary structure 102 after firing in an oven. LTCC layers 104–112 are commercially available in the form of a green unfired tape from Dupont Corporation. Each of the layers has a top surface 104A, 106A, 108A, 110A and 112A. Similarly, each of the layers has a bottom surface 104B, 106B, 108B, 110B and 112B. The layers have several circuit features that are patterned on the surfaces. Multiple conductive vias 118 extend through each of the layers. Vias 118 are formed from an electrically conductive material and electrically connect circuit features on one layer to circuit features on another layer.

Layer 104 has several circuit features that are patterned on surface 104A. Surface 104A has twelve terminals 120A, 120B, 120C, 120D, 120E, 120F, 120G, 120H, 120I, 120J, 120K and 120L. The terminals 120A, 120C, 120E, 120F, 120G, 120H, 120J, 120K and 120L are electrically connected to vias 118. Resistors 122, 124 and 126 are located on surface 104A. Resistor 122 is connected between terminals 120A and 120H. Resistor 124 is connected between terminals 120C and 120G. Resistor 126 is connected between terminals 120E and 120F. Resistors 122, 124 and 126 are covered by an insulative overglaze 130A, 130B and 130C, respectively, to protect the resistors from abrasion and shorting. Insulative overglaze 130D covers a portion of terminal 120J. An orientation mark 132 is placed on top surface 104A in order to properly align the power splitter during subsequent manufacturing operations. Resistors 122, 124 and 126 have a value of 50 ohms.

Layer 106 has a circuit line 134 and via connectors 136 formed on surface 106A. Circuit line 134 is connected by vias 118 to terminals 120F, 120G and 120H. Via connectors 136 connect similarly connected vias together in order to provide a more redundant signal path through substrate 102. Layer 108 has via connectors 138 formed on surface 108A.

Layer 110 has a capacitor electrode 142 and via connectors 140 formed on surface 110A. Capacitor electrode 142 is connected by vias 118 to terminal 120J. Capacitor electrode 142 forms capacitor C1 of FIG. 1. The capacitor has a value of 8 picofarads.

Layer 112 has a mesh ground plane 144 formed on surface 112A. Ground plane 144 is connected by vias 118 to terminal 120. Layer 112 has ten terminals 150A, 150B, 150C, 150D, 150E, 150F, 150G, 150H, 150I and 150J formed on surface 112B. The terminals are electrically connected to vias 118. Terminal 150A is connected to terminal 120A through a via. Terminal 150B is connected to ground plane 144 through a via. Terminal 150C is connected to terminal 120C through a via. Terminal 150D is connected to ground plane 144 through a via. Terminal 150E is connected to terminal 120E through a via. Terminals 150F and 150G are connected to terminal 120L and ground plane 144 through a via. Terminal 150H is connected to terminal 120K through a via. Terminals 150I and 150J are connected to ground plane 144 through a via. An orientation mark 152 is placed on bottom surface 112B.

A substrate 102 was fabricated with dimensions of 0.3 inches in length by 0.25 inches wide by 0.03 inches in height. Substrate 102 can be smaller than these dimensions. The size of substrate 102 is considerably smaller than those of the prior art. The vias have a diameter of 0.008 inches. The capacitor electrode 142 is 0.11 inches by 0.11 inches. The terminals measure 0.04 inches by 0.033 inches. The resistor is 0.004 inches in thickness or height.

Turning now to FIGS. 5, 6, 7 and 9, transformers 160, 170, 180 and 190 are mounted to substrate 102. The transformers perform the power splitting and matching functions. Input transformer 160 is mounted over insulative overglaze 130D above terminal 120J and 120I. Output transformer 170 is mounted over insulative overglaze 130A above resistor 122. Output transformer 180 is mounted over insulative overglaze 130B above resistor 124. Output transformer 190 is mounted over insulative overglaze 130C above resistor 126. The transformers are attached to substrate 102 by an adhesive 200. Adhesive 200 can be an epoxy or other suitable glue.

Transformer 160 has a ferrite core 161 with a hole 162. Wires 163 and 164 pass through hole 162 and are wrapped around core 161. Wire 163 has 3.5 turns around core 161. Wire 164 has 2.5 turns around core 161. Wire 163 has ends 163A and 163B. End 163A is connected to terminal 120J. End 163B is connected to terminal 120L. Wire 164 has ends 164A and 164B. End 164A is connected to terminal 120J. End 164B is connected to terminal 120K.

Transformer 170 has a ferrite core 171 with a hole 172. Wires 173, 174, 175 and 176 pass through hole 172. Wire 173 has ends 173A and 173B. End 173A is connected to terminal 120A. End 173B is connected to terminal 120I. Wire 174 has ends 174A and 174B. End 174A is connected to terminal 120A. End 174B is connected to terminal 120I. Wire 175 has ends 175A and 175B. End 175A is connected to terminal 120A. End 175B is connected to terminal 120I. Wire 176 has ends 176A and 176B. End 176A is connected to terminal 120B. End 176B is connected to terminal 120J.

Transformer 180 has a ferrite core 181 with a hole 182. Wires 183 and 184 pass through hole 182. Wire 183 has ends 183A and 183B. End 183A is connected to terminal 120B. End 183B is connected to terminal 120C. Wire 184 has ends 184A and 184B. End 184A is connected to terminal 120D. End 184B is connected to terminal 120J.

Transformer 190 has a ferrite core 191 with a hole 192. Wires 193, 194, 195 and 196 pass through hole 192. Wire 193 has ends 193A and 193B. End 193A is connected to terminal 120D. End 193B is connected to terminal 120E. Wire 194 has ends 194A and 194B. End 194A is connected to terminal 120I. End 194B is connected to terminal 120J. Wire 195 has ends 195A and 195B. End 195A is connected to terminal 120I. End 195B is connected to terminal 120J. Wire 196 has ends 196A and 196B. End 196A is connected to terminal 120I. End 196B is connected to terminal 120J.

The wire ends can be attached to the terminals by soldering, welding or wire bonding. Terminal 150H forms input port 22. Terminal 150A forms output port 23. Terminal 150C forms output port 24. Terminal 150E forms output port 24.

A three way power splitter 100 was fabricated using substrate 102. The transformer cores 161, 171, 181 and 191 measured 0.072 inches by 0.072 inches by 0.047 inches. 36 gauge wires were used. Wire 163 has 3.5 turns around core 161. Wire 164 has 2.5 turns around core 161. The other wires just pass through their respective cores.

In use, three way power splitter 100 would be mounted to an external printed circuit board (not shown). The bottom terminals 150 would be attached to the printed circuit board using a reflowed solder paste. Solder paste would be screen printed onto the printed circuit board. Terminals 150 would be placed onto the solder paste and melted in a re-flow oven to attach the power splitter package 100 to the printed circuit board.

Three way power splitter 100 can be assembled in the following manner:

1. Low temperature ceramic substrate 102 is fabricated.
2. Transformers 160, 170, 180 and 190 have the appropriate wires 163, 164, 173, 174, 175, 176, 183, 184, 193, 194, 195 and 196 wound and placed on the transformers.
3. Adhesive 200 is dispensed onto the top of insulative overglaze 130A, 130B, 130C and 130D.
4. Transformers 160, 170, 180 and 190 are placed on adhesive 200 and cured.
5. The ends of wires 163, 164, 173, 174, 175, 176, 183, 184, 193, 194, 195 and 196 are welded to the appropriate terminals.
6. The completed assembly is tested for electrical performance.

The present invention has several advantages. Since, the resistors 122, 124, 126 and capacitor C1 are integrated into the low temperature co-fired ceramic substrate 102, they do not have to be mounted separately adjacent to a transformer. This allows for a smaller package that can be assembled faster at lower cost.

Another advantage of the present invention is that fabricating the three way power splitter using a low temperature co-fired ceramic substrate results in more uniform electrical characteristics in the power splitter.

Another advantage of the present invention is that it eliminates the need for using binocular core transformers.

A further advantage of the present invention is that twisted pair wires are eliminated.

A further advantage of the present invention is that wrap around metal leads are eliminated.

Another advantage of the present invention is that the design allows for automated assembly processing. Automated assembly reduces the cost of manufacturing the end product A further advantage of the present invention is that it has a very low overall height due to elimination of the binocular core transformers.

Figure 10:
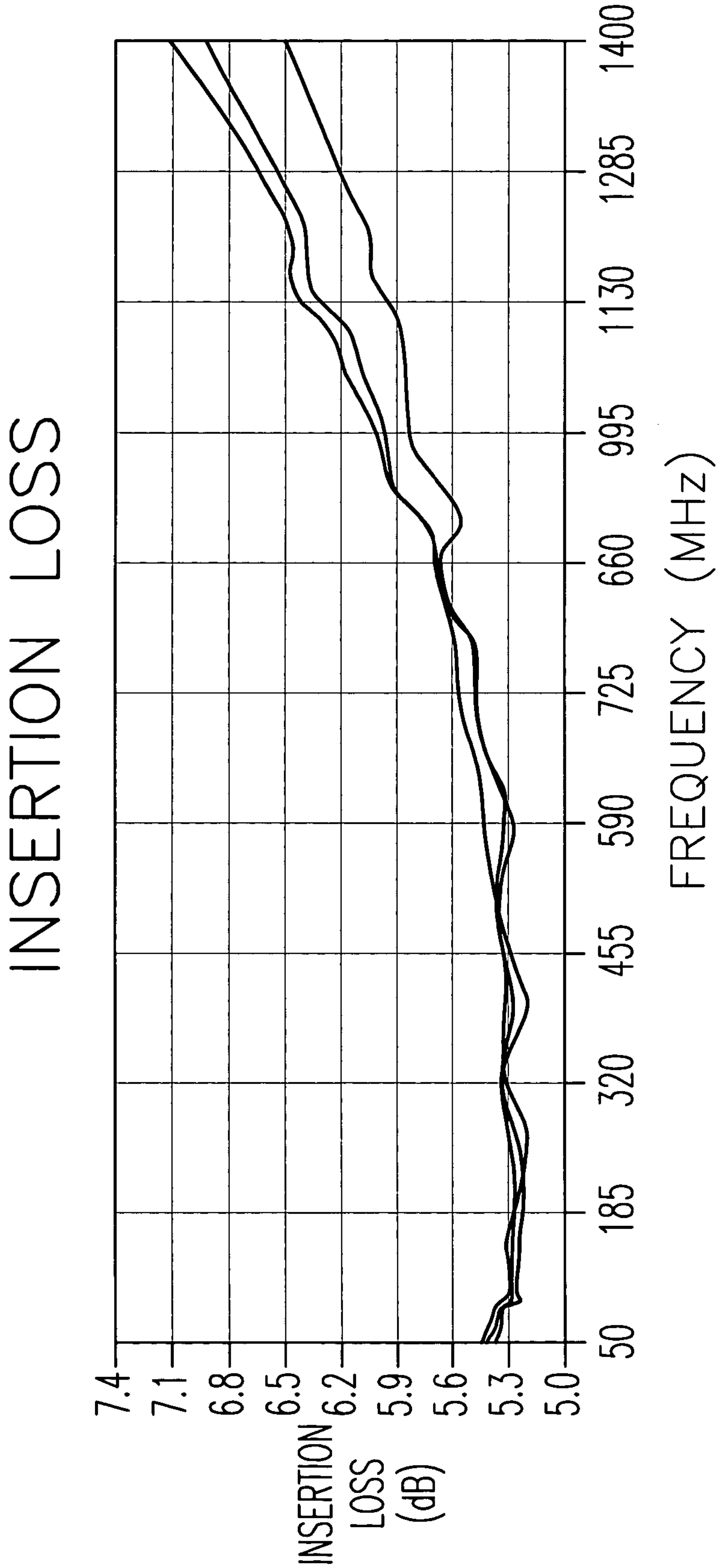
FIG. 10 is a graph showing insertion loss versus frequency for the power splitter of FIG. 5.
Figure 11:
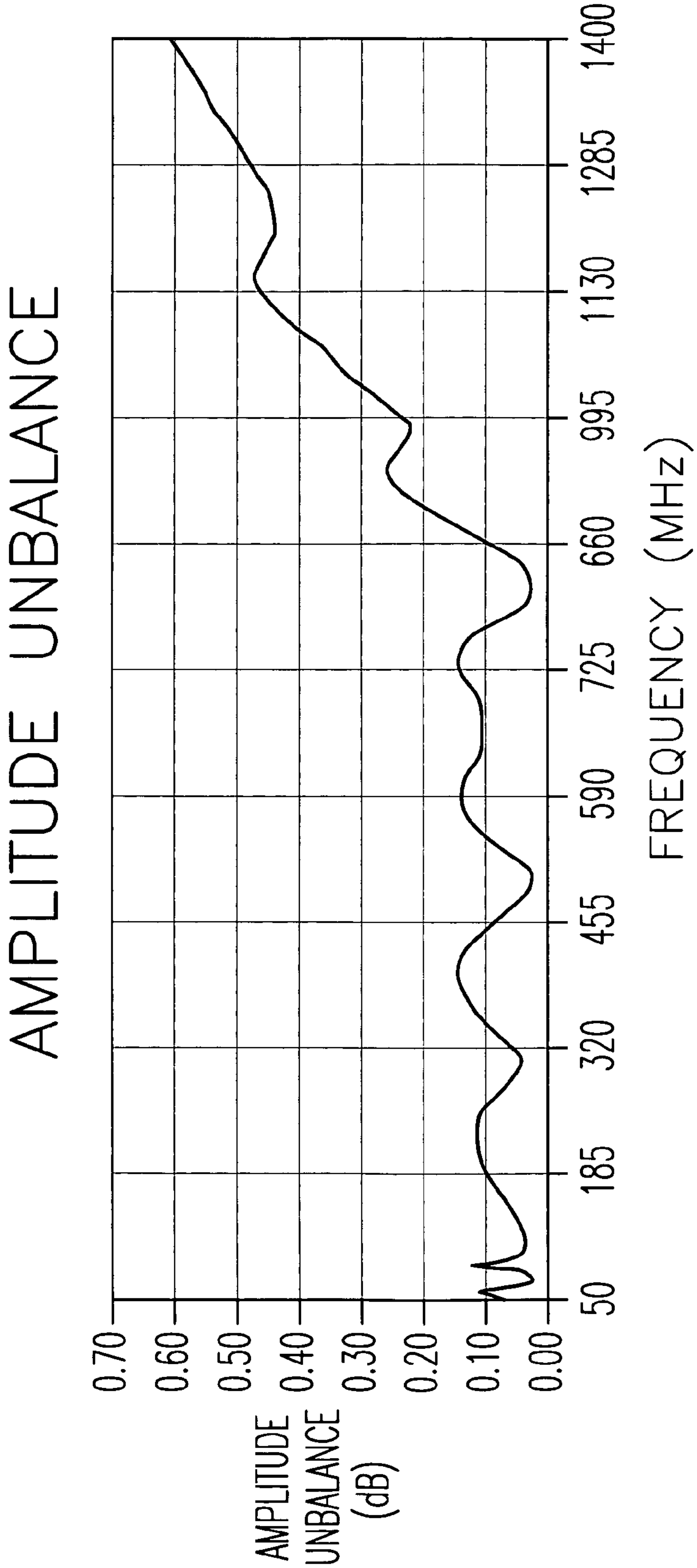
FIG. 11 is a graph showing amplitude imbalance versus frequency for the power splitter of FIG. 5.

Referring to FIG. 10, a graph showing the insertion loss for three way power splitter 100 is shown for frequencies from 50 to 1400 MHz. FIG. 11 shows a graph of amplitude unbalance versus frequency for three way power splitter 100. Amplitude unbalance is the difference of output power between the output ports.

Figure 12:
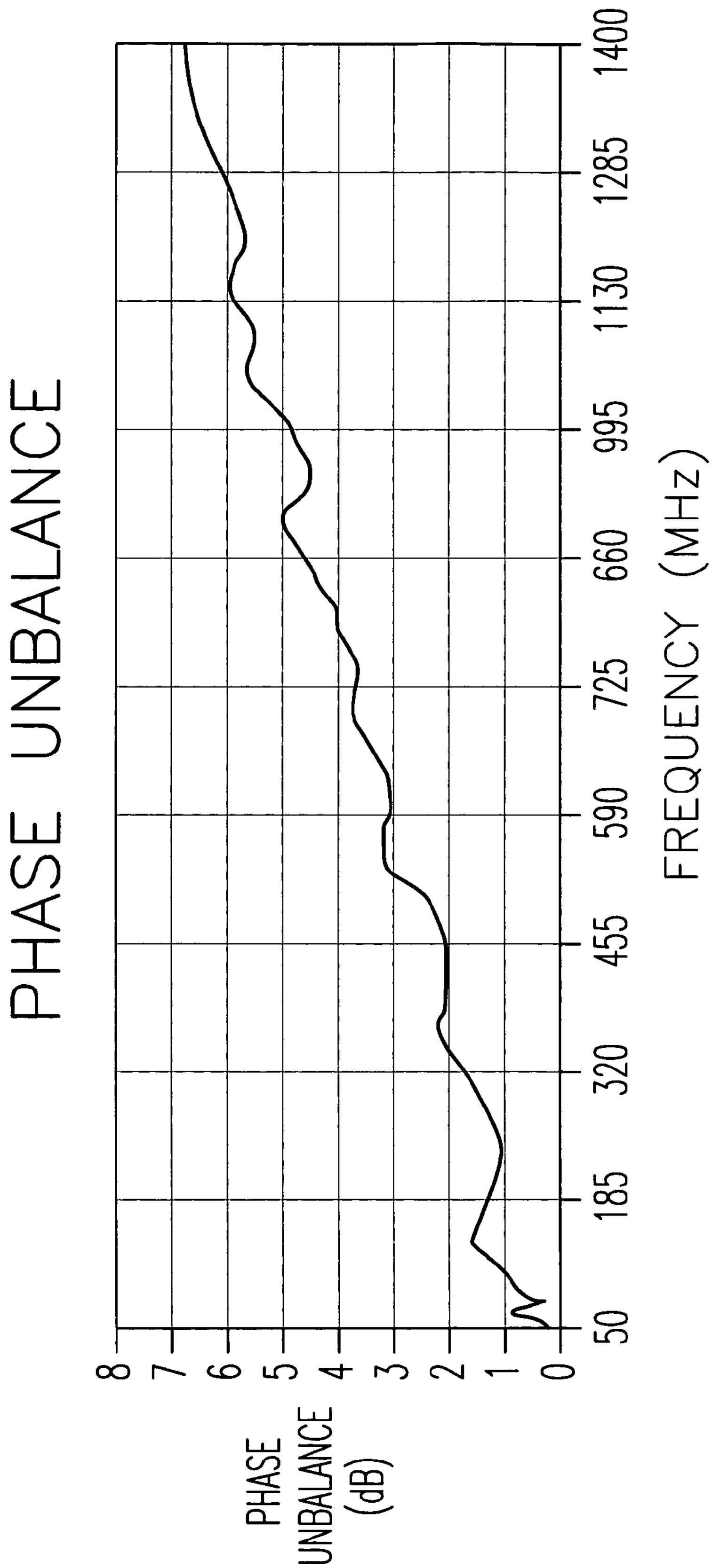
FIG. 12 is a graph showing phase unbalance versus frequency for the power splitter of FIG. 5.
Figure 13:
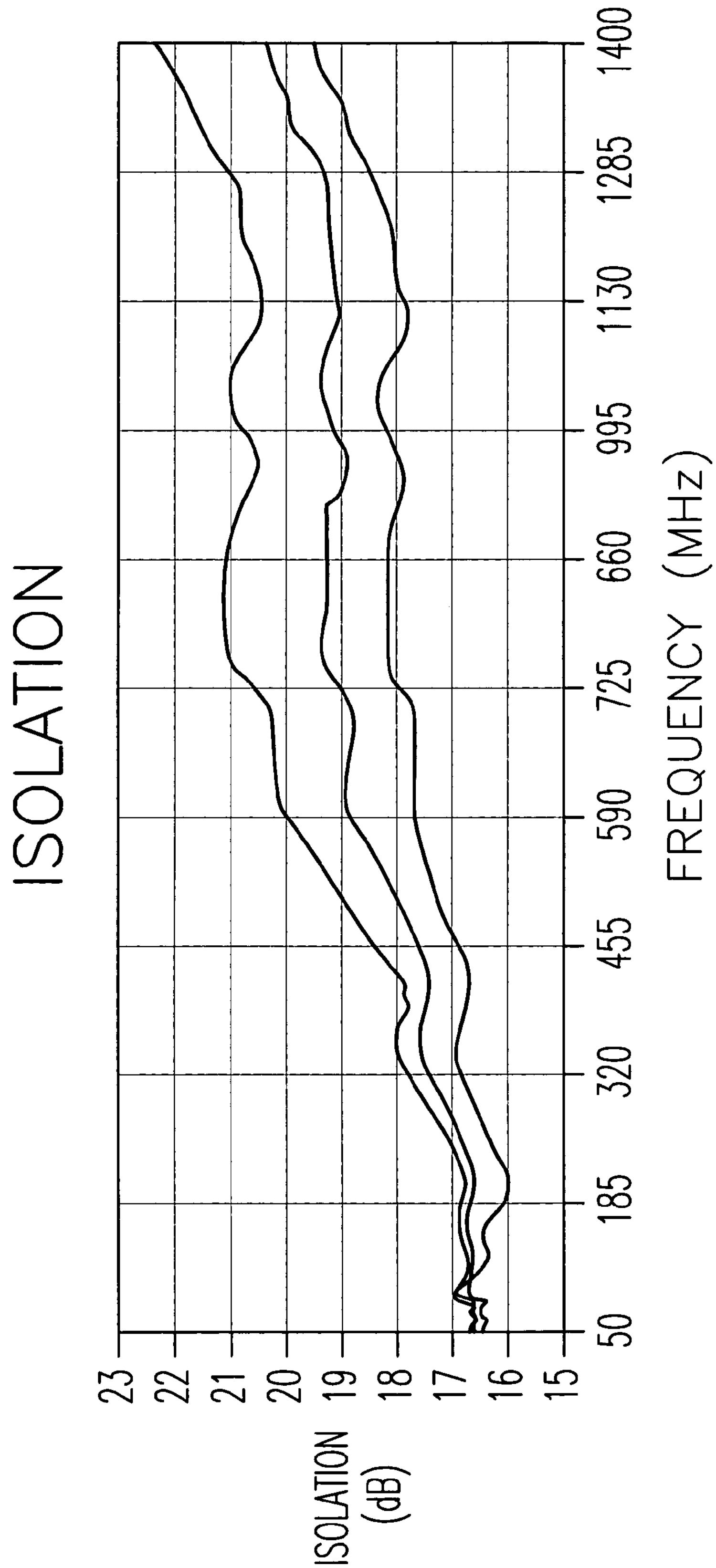
FIG. 13 is a graph showing isolation versus frequency for the power splitter of FIG. 5.
Figure 14:
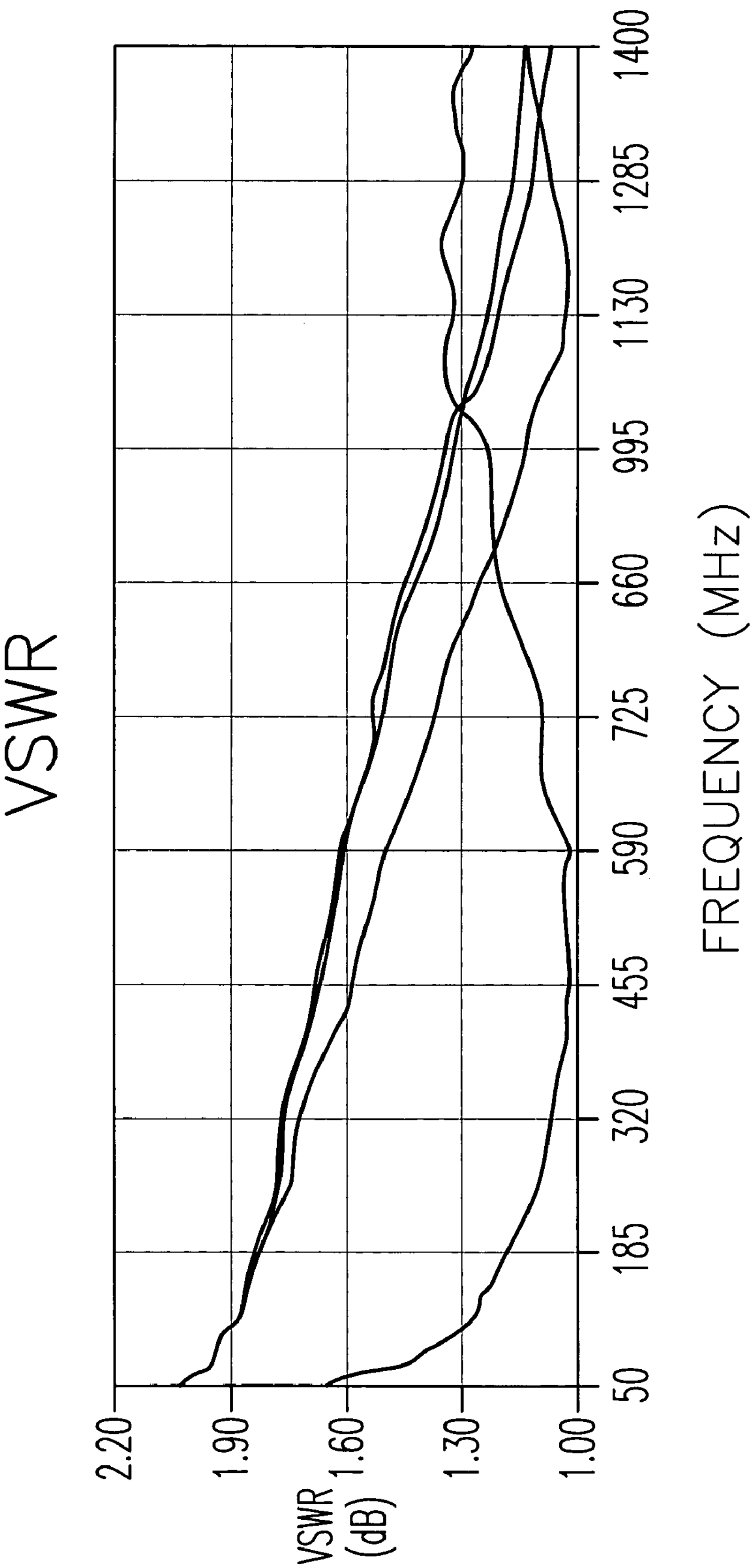
FIG. 14 is a graph showing VSWR versus frequency for the power splitter of FIG. 5.

FIG. 12 is a graph showing phase unbalance versus frequency for the three way power splitter. FIG. 13 shows a graph of isolation versus frequency at the three output ports. FIG. 14 shows a graph of VSWR versus frequency for the three way power splitter 100. The graphs show that three way power splitter 100 has good electrical performance.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A power splitter comprising:

a) a substrate having a top layer, a bottom layer, and a plurality of inner layers;

b) a first resistor formed on the top layer, the first resistor having a first and second end;

c) a second resistor formed on the top layer, the second resistor having a third and fourth end, the second end of the first resistor connected to the fourth end of the second resistor;

d) a third resistor formed on the top layer, the third resistor having a fifth and sixth end, the second end of the first resistor connected to the fifth end of the third resistor;

e) a capacitor formed between the inner layers, the capacitor having a seventh end and an eighth end;

f) a plurality of terminals located on the top and bottom layers;

g) a plurality of vias extending through the substrate, the vias electrically connecting the resistors, the capacitor and the terminals;

h) a first transformer attached to the top layer and connected to a first terminal, the first terminal forming an input port, the seventh end of the capacitor connected to the first transformer, the eighth end of the capacitor connected to a ground terminal;

i) a second transformer attached to the top layer and connected to a second terminal, the second terminal forming a first output port, the first end of the first resistor connected to the second terminal;

j) a third transformer attached to the top layer and connected to a third terminal, the third terminal forming a second output port, the third end of the second resistor connected to the third terminal; and k) a fourth transformer attached to the top layer and connected to a fourth terminal, the fourth terminal forming a third output port, the sixth end of the third resistor connected to the fourth terminal, such that an electrical signal applied to the input port is split between the first, second and third output ports.

2. The power splitter according to claim 1, wherein the substrate is formed from layers of low temperature co-fired ceramic.

3. The power splitter according to claim 1, wherein the capacitor has an electrode formed on one of the inner layers.

4. The power splitter according to claim 1, wherein the transformers are attached to the top layer of the substrate using an adhesive.

5. The power splitter according to claim 1 wherein an insulative overglaze is located over the resistors below the transformers.

6. The power splitter according to claim 1 wherein the first transformer has a first core, the second transformer has a second core, the third transformer has a third core and the fourth transformer has a fourth core.

7. The power splitter according to claim 6 wherein a first and second wire are wound on the first core.

8. The power splitter according to claim 6 wherein a third, fourth, fifth and sixth wire pass through the second core.

9. The power splitter according to claim 6 wherein a seventh and eighth wire pass through the third core.

10. The power splitter according to claim 6 wherein a ninth, tenth, eleventh and twelfth wire pass through the fourth core.

11. A power splitter comprising:

a) a substrate having a first, second, third, fourth and fifth layer;

b) an input transformer attached to the first layer, the input transformer having a first wire connected to an input port and a second wire connected to a ground terminal;

c) a first output transformer attached to the first layer, the first output transformer having a third wire connected to a first output port;

d) a second output transformer attached to the first layer, the second output transformer having a fourth wire connected to a second output port and e) a third output transformer attached to the first layer, the third output transformer having a fifth wire connected to a third output port;

f) a first resistor located on the first layer under the first transformer, the first resistor having one end connected to the first output port;

g) a second resistor located on the first layer under the second transformer, the second resistor having one end connected to the second output port;

h) a third resistor located on the first layer under the third transformer, the third resistor having one end connected to the third output port, the other ends of the resistors connected together in common;

i) a capacitor formed on the fourth layer, the capacitor connected to the second wire; and j) a plurality of vias extending through the substrate, the vias electrically connecting the resistors, the capacitor and the wires.

12. The power splitter according to claim 11, wherein the layers are a low temperature co-fired ceramic.

13. The power splitter according to claim 11, wherein the transformers are attached to the top layer of the substrate using an adhesive.

14. The power splitter according to claim 11, wherein an insulative overglaze is located between the resistors and the transformers.

15. The power splitter according to claim 11, wherein a plurality of terminals are located on the first and fifth layers.

16. The power splitter according to claim 11 wherein the first transformer has a first core, the second transformer has a second core, the third transformer has a third core and the fourth transformer has a fourth core.

17. A three way power splitter comprising:

a) a substrate having a top surface and a bottom surface;

b) a bottom input terminal, a bottom first output terminal, a bottom second output terminal, a bottom third output terminal and a bottom ground terminal located on the bottom surface;

c) a top input terminal, a top first output terminal, a top second output terminal, a top third output terminal and a top ground terminal located on the top surface;

d) a plurality of conductive vias extending between the top and bottom surfaces, the vias connected between respective bottom and top terminals;

e) a first transformer attached to the top surface and connected to the top input terminal and the top ground terminal;

f) a second transformer attached to the top surface and connected to the top first output terminal;

g) a third transformer attached to the top surface and connected to the top second output terminal;

h) a fourth transformer attached to the top surface and connected to the top third output terminal;

i) a first resistor formed on the top surface, the first resistor having a first and second end, the first end connected to the top first output terminal;

j) a second resistor formed on the top surface, the second resistor having a third and fourth end, the third end of the second resistor connected to the top second output terminal;

k) a third resistor formed on the top surface, the third resistor having a fifth and sixth end, the fifth end of the third resistor connected to the top third output terminal, the second, fourth and sixth ends of the resistors connected together; and l) a capacitor formed within the substrate and connected to the first transformer.

18. The power splitter according to claim 17, wherein the substrate is formed from layers of low temperature co-fired ceramic.

19. The power splitter according to claim 17, wherein the transformers are attached to the top surface of the substrate using an adhesive.

20. The power splitter according to claim 17, wherein an insulative overglaze is located over the resistors below the transformers.

21. The power splitter according to claim 17, wherein the first transformer has a first core, the second transformer has a second core, the third transformer has a third core and the fourth transformer has a fourth core.

22. The power splitter according to claim 21 wherein a first and second wire are wound on the first core.

23. The power splitter according to claim 21 wherein a third, fourth, fifth and sixth wire pass through the second core.

24. The power splitter according to claim 21 wherein a seventh and eighth wire pass through the third core.

25. The power splitter according to claim 21 wherein a ninth, tenth, eleventh and twelfth wire pass through the fourth core.

* * * * *